US012775763B1

(12) United States Patent
Liszewski et al.

(10) Patent No.: US 12,775,763 B1
(45) Date of Patent: Oct. 27, 2026

(54) METHODS AND APPARATUS FOR NETLIST DECOMPILATION

(71) Applicant: Battelle Memorial Institute, Columbus, OH (US)

(72) Inventors: Katie Liszewski, Columbus, OH (US); Tim McDonley, Columbus, OH (US); Josh Delozier, Columbus, OH (US); Andrew Elliott, Columbus, OH (US); Dylan Jones, Columbus, OH (US); Matt Sutter, Columbus, OH (US); Adam Kimura, Columbus, OH (US)

(73) Assignee: Battelle Memorial Institute

( * ) Notice: Subject to any disclaimer, the term of this patent is extended or adjusted under 35 U.S.C. 154(b) by 934 days.

(21) Appl. No.: 17/162,775

(22) Filed: Jan. 29, 2021

Related U.S. Application Data

(60) Provisional application No. 62/968,136, filed on Jan. 30, 2020.

(51) Int. Cl.
*G06F 30/327* (2020.01)
*G06F 8/53* (2018.01)

(52) U.S. Cl.
CPC .............. *G06F 30/327* (2020.01); *G06F 8/53* (2013.01)

(58) Field of Classification Search
CPC ...... G06F 30/323; G06F 30/327; G06F 30/33; G06F 2117/06; G06F 2115/06; G06F 8/53; H01J 2237/31798
See application file for complete search history.

(56) References Cited

U.S. PATENT DOCUMENTS

| | | | | |
|---|---|---|---|---|
| 6,190,433 | B1 * | 2/2001 | Van Fleet ............... | G06F 30/33 703/2 |
| 6,658,630 | B1 * | 12/2003 | Threatt ................... | G06F 30/30 716/103 |
| 6,874,134 | B1 * | 3/2005 | Collin ..................... | G06F 30/30 716/103 |

(Continued)

OTHER PUBLICATIONS

Benz et al., "BIL: A Tool-Chain for Bitstream Reverse-Engineering," IEEE, (2012).

(Continued)

*Primary Examiner* — Nha T Nguyen
(74) *Attorney, Agent, or Firm* — Volpe Koenig

(57) ABSTRACT

A method performed by a computing device may comprise receiving a netlist and converting primitive tables and library instances of the netlist to behavioral code. The netlist may be flattened by replacing sub-module instances with respective code. A number of unnecessary variables may be reduced by replacing input and output with corresponding wires from a top-level module of the netlist. The netlist may be parsed to produce an AST. Sequential and combinational graphs may be generated. A list of all sub-modules instantiated within the design may also be generated. The method may further comprise looking for the definitions of the sub-modules within the netlist or a helper library file and determining whether the top-level module contains instances of user-defined primitives. Any user-defined primitives may be converted into equivalent module definitions. Directive graphs may be generated from the AST. Hierarchy may be restored and module reconstruction may be performed.

17 Claims, 14 Drawing Sheets

(56) References Cited

U.S. PATENT DOCUMENTS

| | | | | |
|---|---|---|---|---|
| 8,601,412 | B1 * | 12/2013 | O'Riordan | G06F 30/38 716/101 |
| 9,830,414 | B2 * | 11/2017 | Saghizadeh | G06F 30/36 |
| 11,030,348 | B2 * | 6/2021 | Tehranipoor | G06F 30/327 |
| 2005/0138583 | A1 * | 6/2005 | Ouyang | G06F 30/33 716/108 |
| 2010/0169871 | A1 * | 7/2010 | Villadsen | G06F 8/75 717/144 |
| 2015/0100928 | A1 * | 4/2015 | Saghizadeh | G06F 30/31 716/102 |
| 2015/0100929 | A1 * | 4/2015 | Redekopp | G10L 19/032 716/103 |
| 2016/0189720 | A1 * | 6/2016 | Villemoes | G10L 19/0208 704/205 |
| 2019/0102502 | A1 * | 4/2019 | Chao | H01L 23/573 |
| 2019/0206040 | A1 * | 7/2019 | Green | G06F 21/14 |
| 2020/0057681 | A1 * | 2/2020 | Mamaghani | G06F 11/3648 |

OTHER PUBLICATIONS

Brunner et al., "Improving on State Register Identification in Sequential Hardware Reverse Engineering," IEEE International Symposium on Hardware-Oriented Security and Trust (HOST), (2019).

Cifuentes, "Reverse Compilation Techniques," PhD dissertation, Queensland University of Technology (1994).

Graf et al., "Ensuring Design Integrity through Analysis of FPGA Bitstreams and IP Cores," International Conference on Reconfigurable Systems and Algorithms (2012).

Meade et al., "Gate-level Netlist Reverse Engineering for Hardware Security: Control Logic Register Identification," ISCAS, pp. 1334-1337 (2016).

program-transformation.org, "Decompilation Process," available at https://www.program-transformation.org/Transform/DecompilationProcess (Feb. 21, 2005).

* cited by examiner

800

1100

1102
```
count[0x0] == (T1)
_0___1 == (T1 ^ 1)
_0___2 == (count[0x1] ^ T1)
_0___3 == (count[0x2] ^ (T1 & count[0x1]))
_0___4 == (count[0x3] ^ (count[0x2] & (T1 & count[0x1])))
T0 == (1)
```

1104
```
{count[0x0]: ['({})', ['T1']]}
{_0___1: ['( {} ^ 1 )', ['T1']]}
{_0___2: ['( {} ^ {} )', ['count[0x1]', 'T1']]}
{_0___3: ['( {} ^ ( {} & {} ) )', ['count[0x2]', 'T1', 'count[0x1]']]}
{_0___4: ['( {} ^ ( {} & ( {} & {} ) ) )', ['count[0x3]', 'count[0x2]', 'T1', 'count[0x1]']]}
{T0: ['(1)', []]}
```

FIG. 11

ALU_Out[1]=(B[1]^A[1])^~[~((B[0]~A[0]) + ~ALU_Sel) + ~(ALU_Sel + (B[0]A[0]))]

common Term subtraction Term Addition Term

METHODS AND APPARATUS FOR NETLIST DECOMPILATION

CROSS REFERENCE TO RELATED APPLICATION

This application claims the benefit of U.S. Provisional Application No. 62/968,136, filed Jan. 30, 2020, which is incorporated by reference as if fully set forth.

STATEMENT OF GOVERNMENT INTEREST

This invention was made with government support under FA8650-17-F-1047, Task Order 0003, awarded by the Air Force Research Laboratory (AFRL). The government has certain rights in the invention.

FIELD OF INVENTION

This invention relates to decompilation, and more specifically, decompilation of integrated circuits using netlists.

BACKGROUND

Over the last few decades, the cost and difficulty of producing integrated circuits at ever shrinking node sizes has vastly increased, resulting in the manufacturing sector moving overseas. Using offshore foundries for chip fabrication, however, may introduce new vulnerabilities into the design flow since there is little to no observability into the manufacturing process. At the same time, both design and optimization are becoming increasingly complex, particularly as system on chip (SoC) designs gain popularity. Common practices such as porting a design across node sizes and reusing cores at multiple area and performance expense tradeoffs further complicates assurance as layout specific features impede comparison.

Methods are described herein for conducting integrated circuit decomposition on fabricated chips to extract the as-fabricated design files, such as a GDSII layout or gate-level netlist. While mature netlist equivalency checking tools may be included with any design flow, there is a lack of tools for performing deeper analyses on the extracted designs for the purposes of hardware assurance or design recovery from obsolete parts. To this end, it may be desirable to develop tools with which to extract functionality from netlists at a higher abstraction level to reconstruct behavioral Register Transfer Level (RTL) code.

SUMMARY

A method performed by a computing device may comprise receiving a netlist and converting primitive tables and library instances of the netlist to behavioral code. The netlist may be flattened by replacing sub-module instances with respective code. A number of unnecessary variables may be reduced by replacing input and output with corresponding wires from a top-level module of the netlist. The netlist may be parsed to produce an abstract syntax tree (AST). Sequential and combinational graphs may be generated. A list of all sub-modules instantiated within the design may also be generated. The method may further comprise looking for the definitions of the sub-modules within the netlist or a helper library file and determining whether the top-level module contains instances of user-defined primitives. Any user-defined primitives may be converted into equivalent module definitions. Directive graphs may be generated from the AST. Hierarchy may be restored and module reconstruction may be performed.

BRIEF DESCRIPTION OF THE DRAWING(S)

FIG. 1 depicts a traditional software decompilation flow and a proposed hardware decompilation flow for behavioral recovery of an extracted netlist;

FIG. 2 portrays a D flip-flop primitive converted to a module with procedural blocks;

Figure 8:
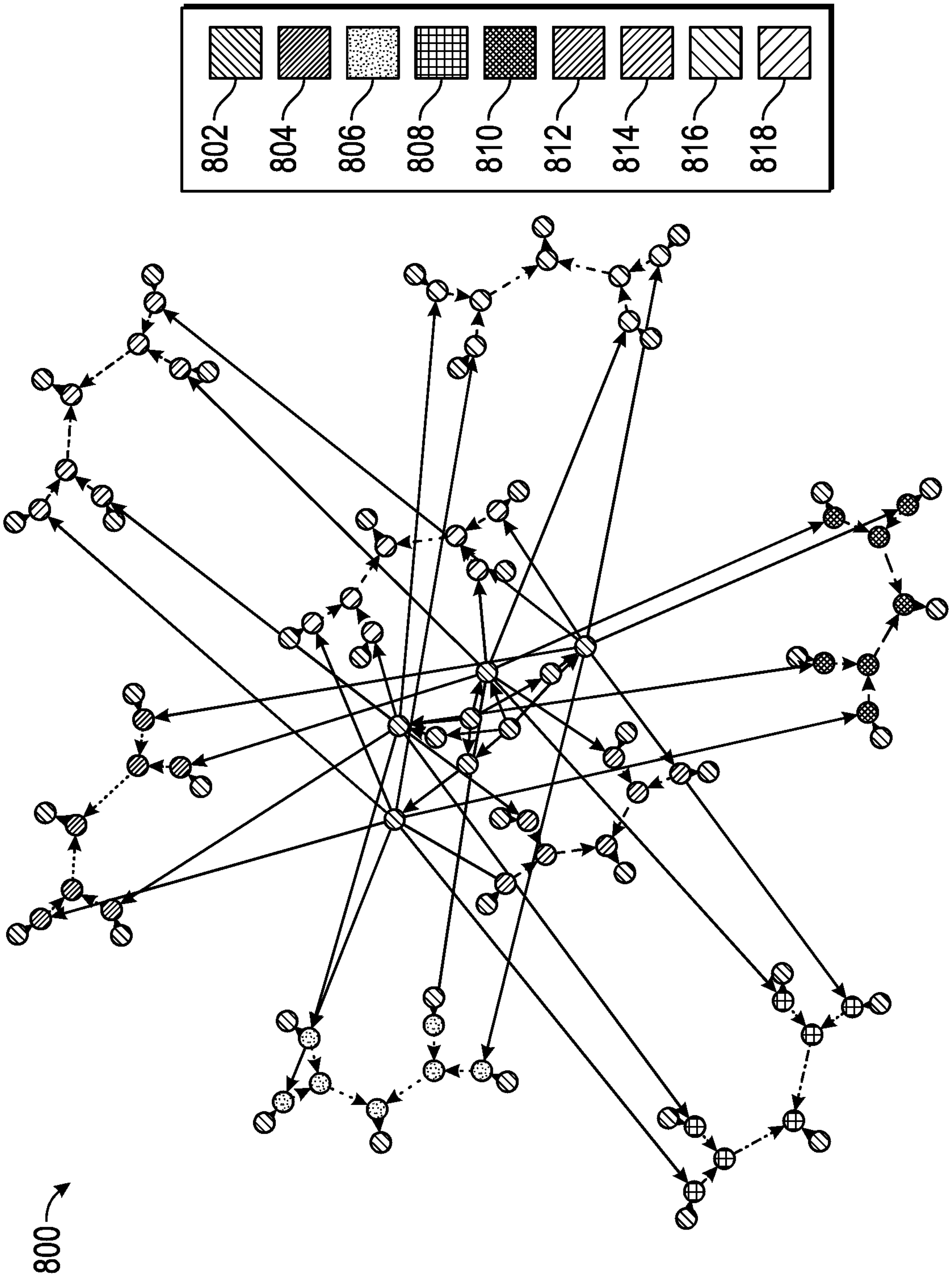
Figure 9:
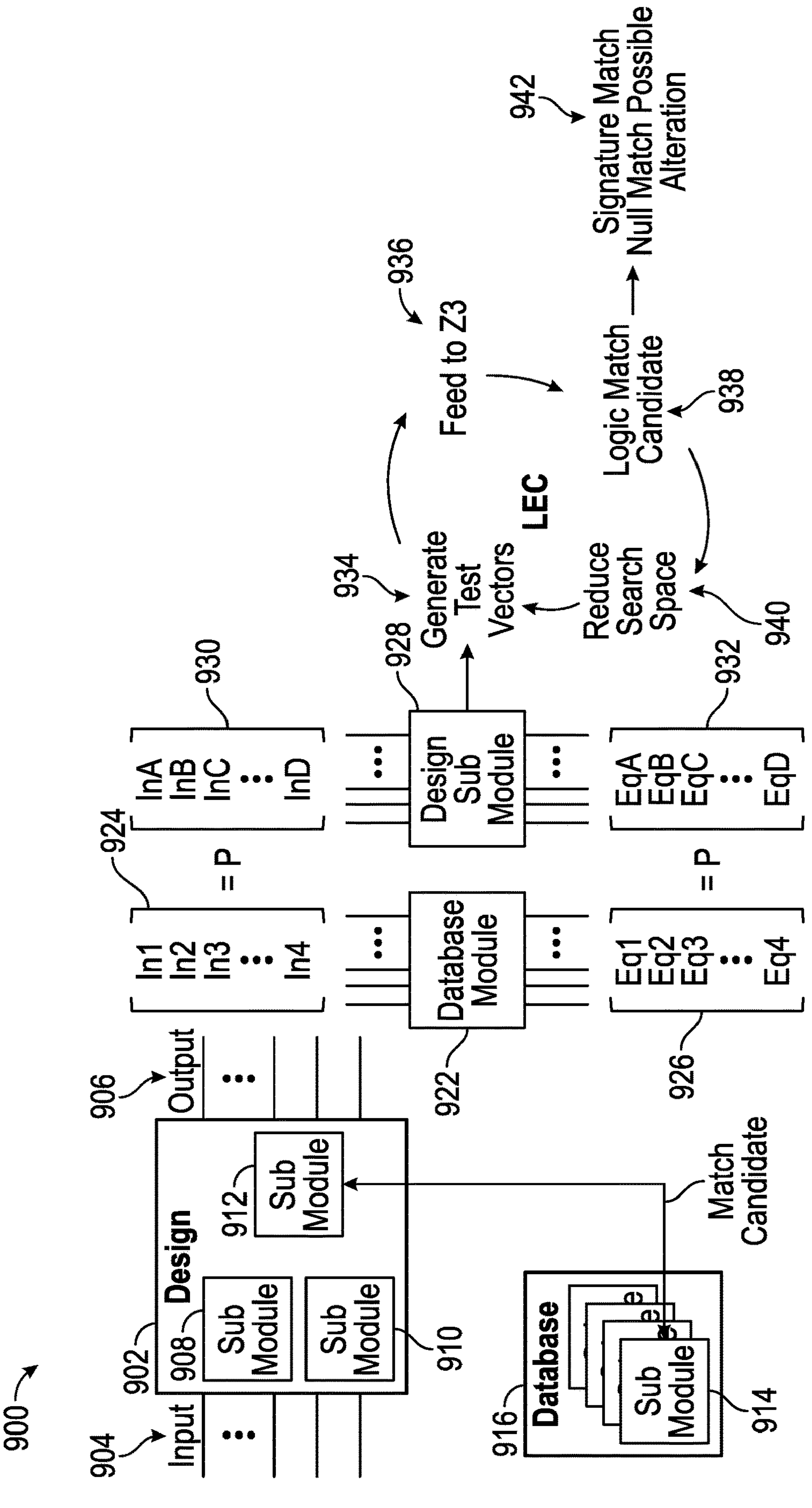
Figure 10:
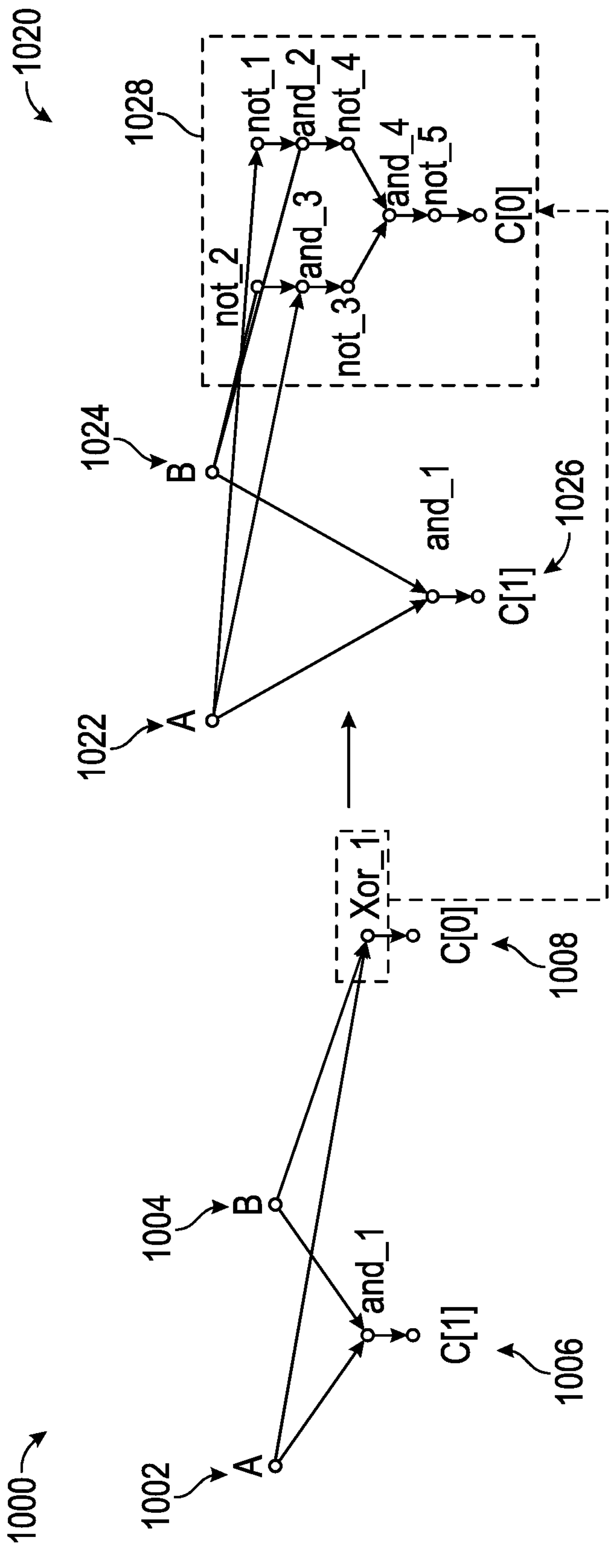
Figure 12:
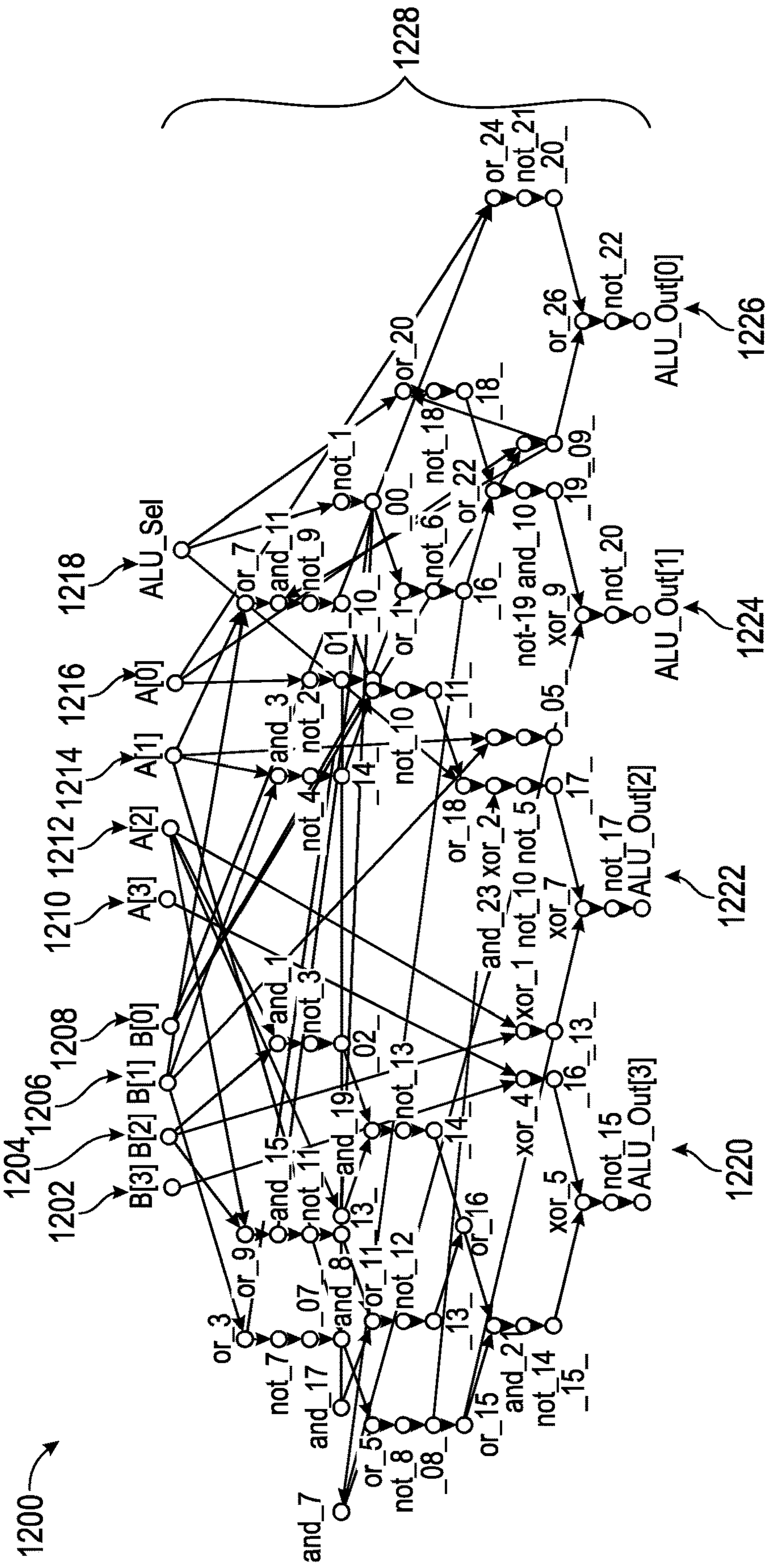
Figure 13:
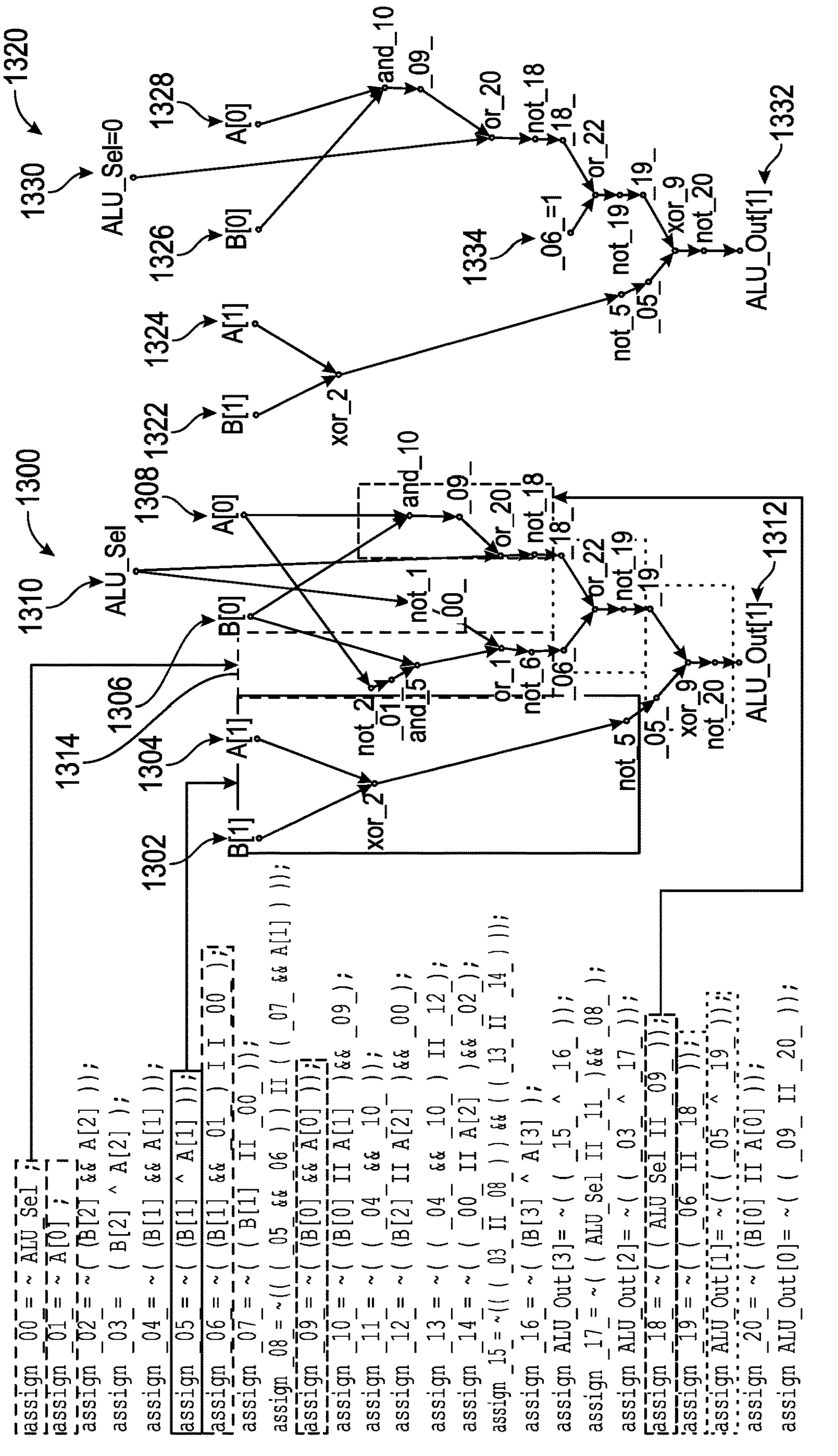
Figure 14:
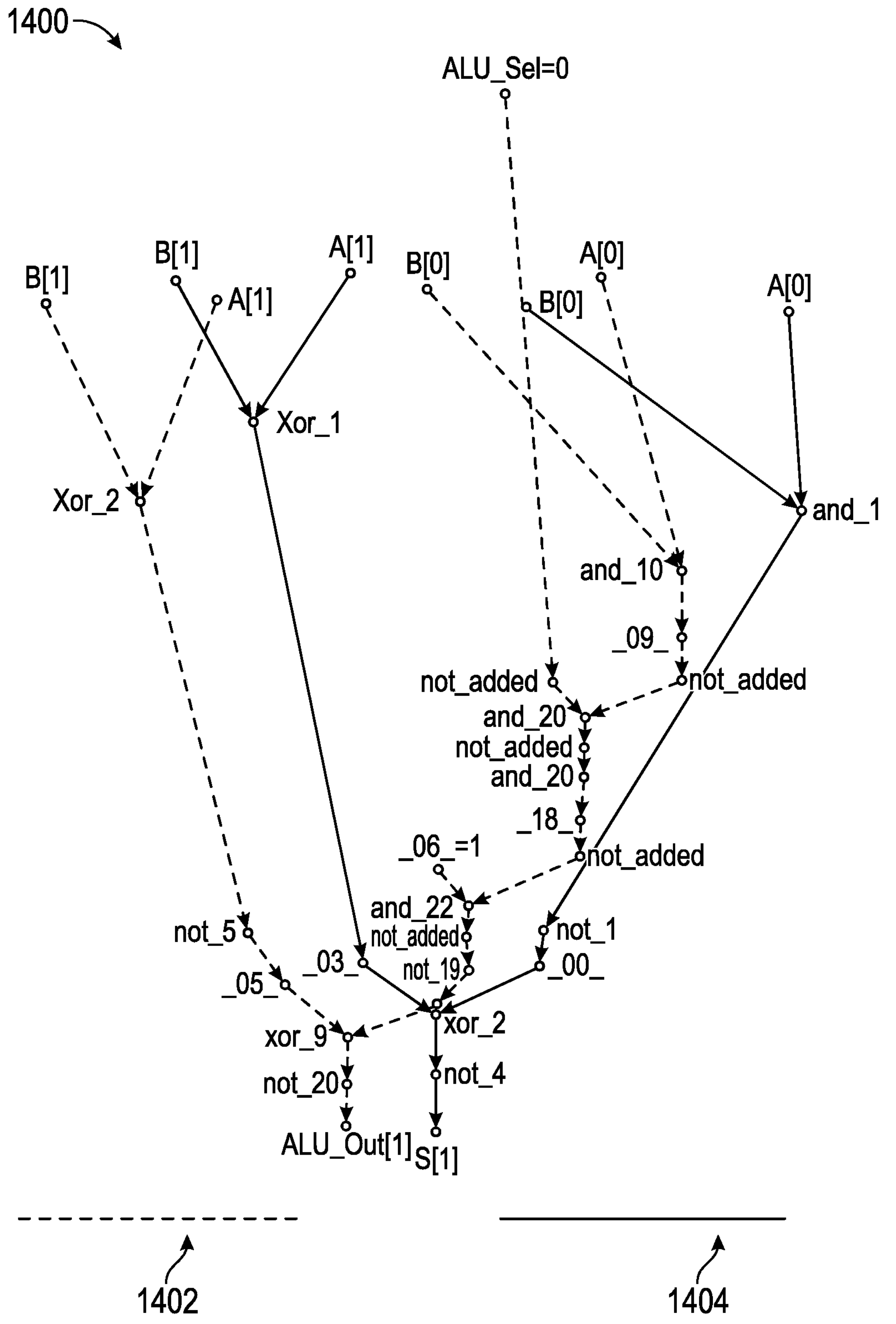

FIG. 8 portrays an input 9-bit multiplexer netlist;

FIG. 9 is a flow diagram illustrating the comparison of modules and submodules as wells as the flow of the logical equivalence checking (LEC) process;

FIG. 10 is an example illustration of a reduction process performed in the case of a half-adder;

FIG. 11 provides an example of extracted logic and a corresponding structural representation in the logic database;

FIG. 12 is an example of an ALU combinatorial graph;

FIG. 13 is an illustration of pruning of a graph;

FIG. 14 depicts an ALU subgraph matched to an output of a 4-bit adder; and

Figure 15:
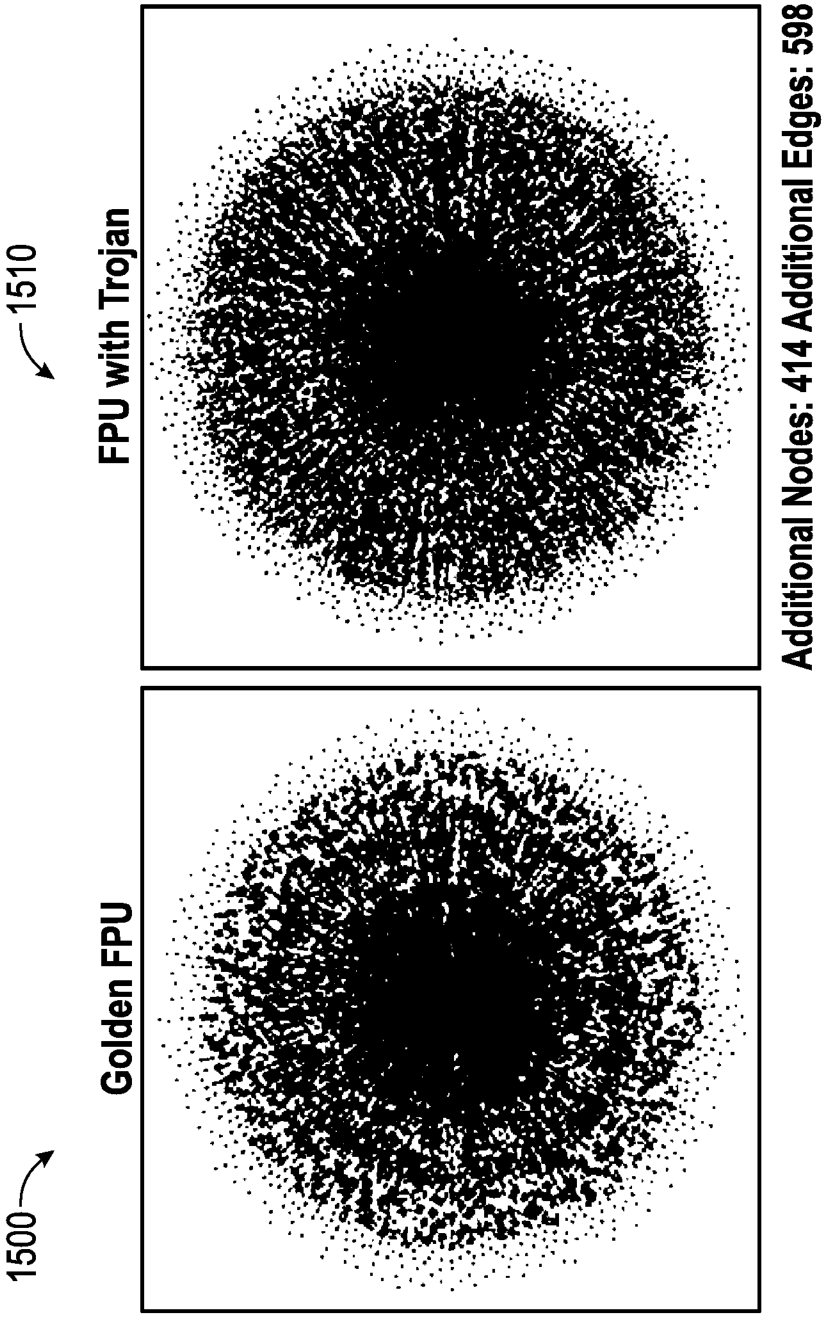

FIG. 15 shows sequential graphs of a golden FPU and an FPU with malicious insertion.

DETAILED DESCRIPTION OF THE PREFERRED EMBODIMENT(S)

Software decompilation is a well-established technique that has been used since the 1960*s* to recover lost source code, verify code against design changes produced by a source code compiler and support the detection of malicious code. In seeking to recover register transfer level (RTL) code, years of expertise in reconstructing functionality are invaluable as the decompilation process is not as well-established. By way of introduction herein, some "hardware decompilation" terminology is used. Disclosed embodiments address aspects of where state of the art software decompilation techniques are relevant and how existing netlist structure recovery techniques fit into a decompilation pipeline. New and useful methods and systems that may be unique to hardware decompilation are provided.

Figure 1:
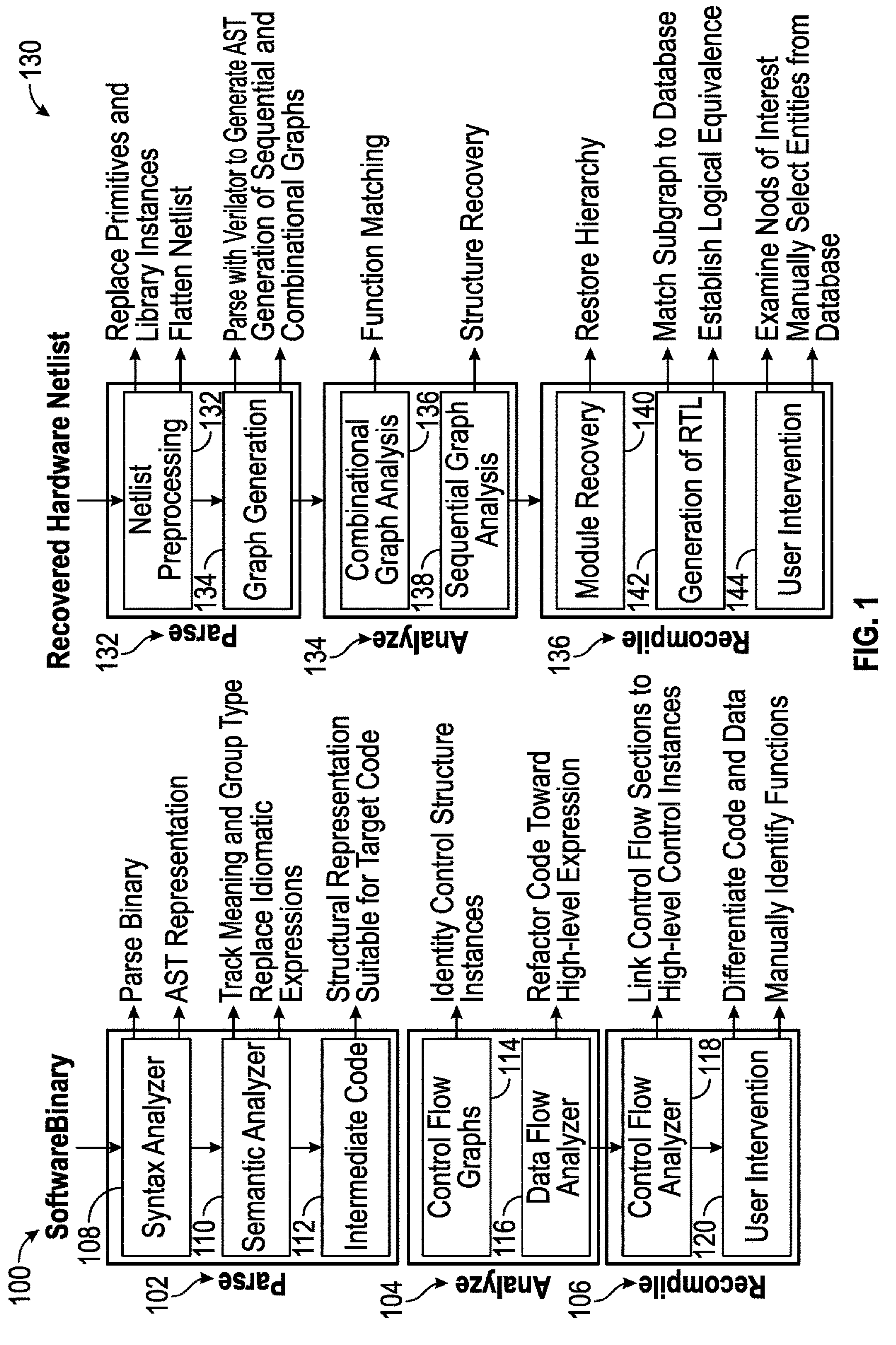

FIG. 1 provides a comparison between software decompilation 100 and proposed hardware decompilation 130 flows. For both types of decompilation 100, 130, the general organizational structure may be comprised of three basic steps: parsing 102, 132, analysis 104, 134, and recompilation 106, 136. In software decompilation 100, a parser may perform parsing 102 by lifting or converting low-level code into language-independent mnemonics called an intermediate language (IL), while maintaining design hierarchy using abstract syntax trees (ASTs) or similar hierarchical data structures.

In the parsing phase 102, a syntax analyzer may be used to perform a binary parse and prepare the AST representation. A semantic analyzer may be used to track meaning and group type and replace idiomatic expressions. Intermediate code may represent a structural representation suitable for target code.

An analysis phase 104 may recover control flow and data or register groupings by considering the software binary as a network graph. This phase may be augmented using well-established graph and information theoretic techniques including identification of known functions, referred to as signature identification. Known functions may, for example, comprise functions taken verbatim or derived from a code or core library, for example, a library provided by a field programmable gate array (FPGA) manufacturer, IP core provider or the like. During the analysis phase 104, control flow graphs 114 may be produced to identify control structure instances. A data flow analyzer 116 may refactor code toward a high-level expression.

The final recompilation phase 106 may simply compile or convert the IL into the language of choice. A control flow analyzer 118 may link control flow sections to high-level control instances. User intervention 120 may be required to differentiate code and data. Functions may need to be manually identified.

Various embodiments directed to netlist preprocessing and graph generation are described herein.

Both hardware decompilation 130 and software decompilation 100 may begin with a format that is designed for machine use and not amenable to human interaction, literal circuitry or bitstreams for application specific integrated circuits (ASICs) and FPGAs, respectively, and machine code for software. The software workflow may start with recognizing and decoding the binary file format using a syntax analyzer 108. This forensics process may be akin to decoding a bitstream into a netlist. The hardware based-workflow may commence with recovery of a netlist from an ASIC, the process of which may be much more difficult and error prone as it may require advanced material decomposition and imaging capabilities. Decompilation may aid in verifying a netlist was accurately recovered by producing a synthesizable, lintable, and readable end product.

With respect to hardware decompilation 130, once a suitable target has been produced, a number of parsing steps 132 as indicated in FIG. 1 may be required before an analysis may be performed. The initial parsing stage 132 for netlists may be considerably less difficult than the parsing stage 102 performed in software. Since machine code and data may be stored together in the same binary format, one outstanding problem in software may be the impossibility of realizing a parser that may distinguish code from data, particularly for architectures with arbitrary instruction lengths such as Intel x86. Netlists, unlike machine code, may be represented in a hardware description language (HDL) and may be easily parsed with a standard HDL parser to produce an AST. Verilator is one such parser that may be used to conduct this process since it is open source, robust, and produces an XML AST, or a similar hierarchal data structure, while requiring only a small amount of preprocessing of the netlist.

In both software and hardware, it may be desirable that the semantic representation used to produce an AST is language-independent. This may be necessary in software decompilation as assembly languages have idiosyncrasies such as branch delay slots and seemingly simple instructions such as call, for example, a. jump, which change several registers simultaneously. Decompilers may have their own intermediate representation language to further improve syntax analysis in the conversion from assembly to source code. Netlists may suffer from similar issues in that they contain standard cells or look up tables (LUTs) and, if recovered directly from a bitstream or a synthesis byproduct, intellectual property (IP) blocks or IP cores. Primitives, which may be defined by directly specifying state transitions, may be another obstacle; therefore, it may be necessary to abstract primitives before the analysis may occur. Since much of a Verilog netlist may be comprised of basic logic, it may be possible to reduce complex statements to simpler Verilog, VHDL or another HDL, rather than create an IL.

Two preprocessing steps may be required before using Verilator. First, netlist processing 132 may be performed to convert primitive tables into behavioral code. This may be performed using, for example, a heavily modified version of PyVerilog. This may introduce events and both improve readability and simplify extraction of data and control flow during the analysis phase. Second, the netlist hierarchy may be flattened by replacing all sub-module instances with their respective code, replacing IO with the corresponding wires from the top-level module to reduce the number of unnecessary variables. Flattening the netlist in this way may allow for easier matching across equivalent designs.

When the source netlist is initially read into the parsing script, a list of all sub-modules instantiated within the design may be generated. The script may then look for the definitions of these sub-modules within, for example, the source netlist file, or a helper library file also provided as an argument to the script. All sub-module definitions may ultimately be appended to a preprocessed version of the source netlist used in later stages of the parsing workflow.

It may be the case that the top-level module contains instances of what are known as Verilog user-defined primitives rather than, or in addition to, modules. While a user-defined primitive and a module may be similar in that both may be viewed as sub-structures that may be instantiated as part of a top-level design, they may also differ in how their behavior is implemented as Verilog code. User-defined primitive definitions may be coded using Verilog 'table' constructs. The table code may separate the primitive's inputs and outputs on the left and right. Each row of the table may specify some combination of input values or edge transitions. The right side of the table may specify the value or transition of the output corresponding to those input conditions.

In the analysis phase 134, following graph generation 134, a combinational graph analysis 136 may be performed for function matching. A sequential graph analysis 138 may be performed for structure recovery.

During recomposition 136, RTL may be generated 142. In some cases, user intervention 144 may be needed to examine nodes of interest and select entities from a database. In some embodiments, however, no user intervention may be required.

Figure 2:
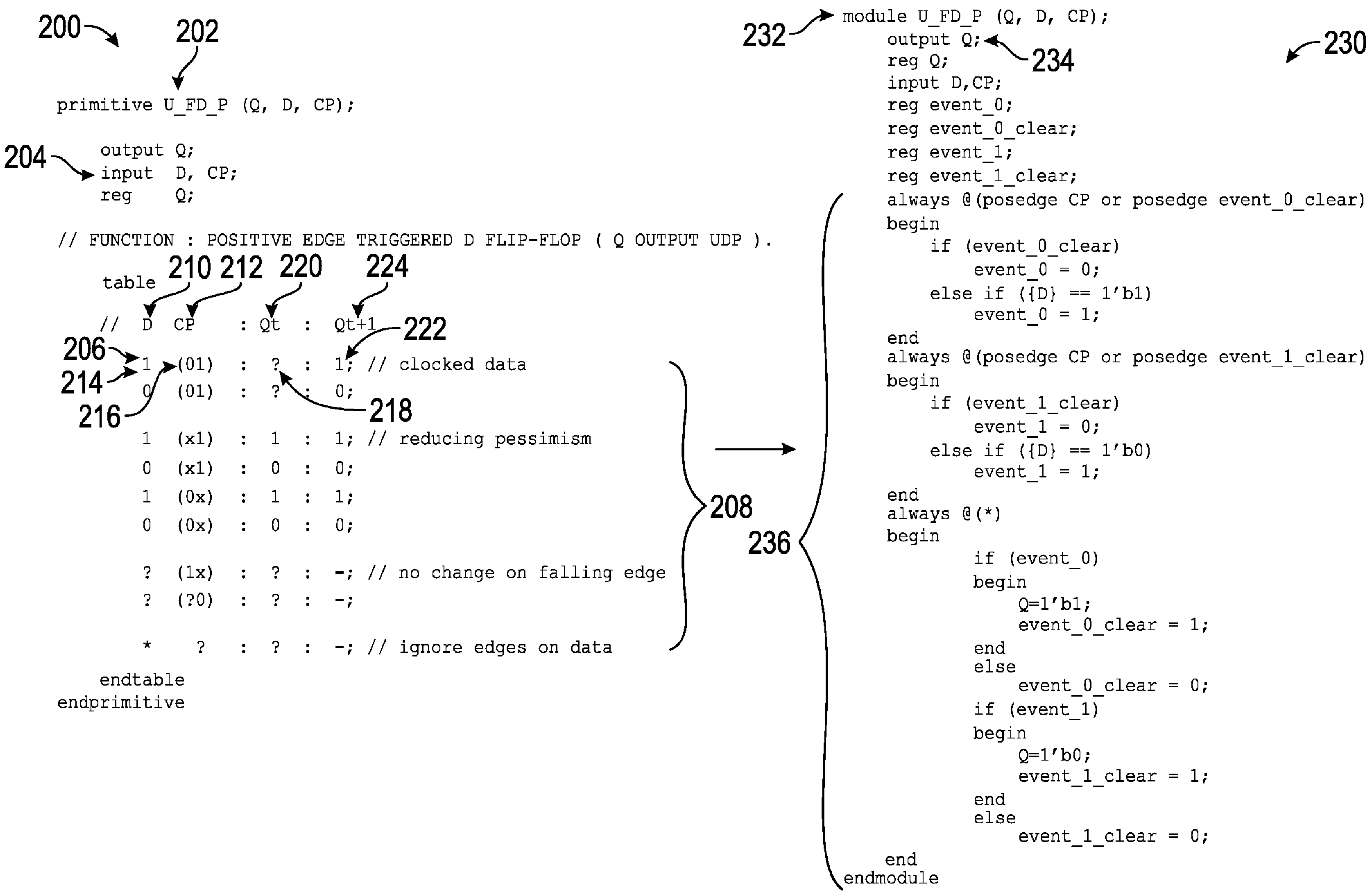

FIG. 2 illustrates the above concept, depicting the simple user-defined primitive definition of a D flip-flop 200 and an equivalent module 230. The code begins with a primitive definition 202, includes lines 204 which define an output, inputs and a register. As shown, a first row 206 of the table 208 provides an example of how the function of the primitive 200 is defined in terms of the rows of the table 208. Under the 'D' column 210 and 'CP' (the clock signal) column 212, respectively, '1' 214 and '(01)' 216 may specify how the output of 'Q' transitions under the condition that the value of 'D' 210 is 1 214 and the clock is making a positive edge transition. At the right side of the table 208, the '?' 218 under the 'Qt' column 220 and the '1' 222 under the 'Qt+1' column 224, respectively, the values '?' and '1' may be interpreted as specifying that when 'D=1' and the clock makes a positive edge transition, the next value of the output 'Q' will be 1 ('Qt+1=1') regardless of its previous value ('Qt=?'). This may be exactly the behavior expected of a positive edge triggered D flip-flop.

A key phase of the preprocessing step may involve converting user-defined primitives into equivalent module definitions. This not only regularizes the structure of an XML Syntax Tree, but may also define the behavior of the primitive making use of procedural always blocks rather than tables. The use of procedural blocks may allow for an easier construction of the sequential graph of the device later in the workflow.

Module 130 includes a module definition 232 and lines 234 specifying the output, input and a register. Lines 236 represent an equivalent the table 208 of the primitive definition 200.

Figure 3:
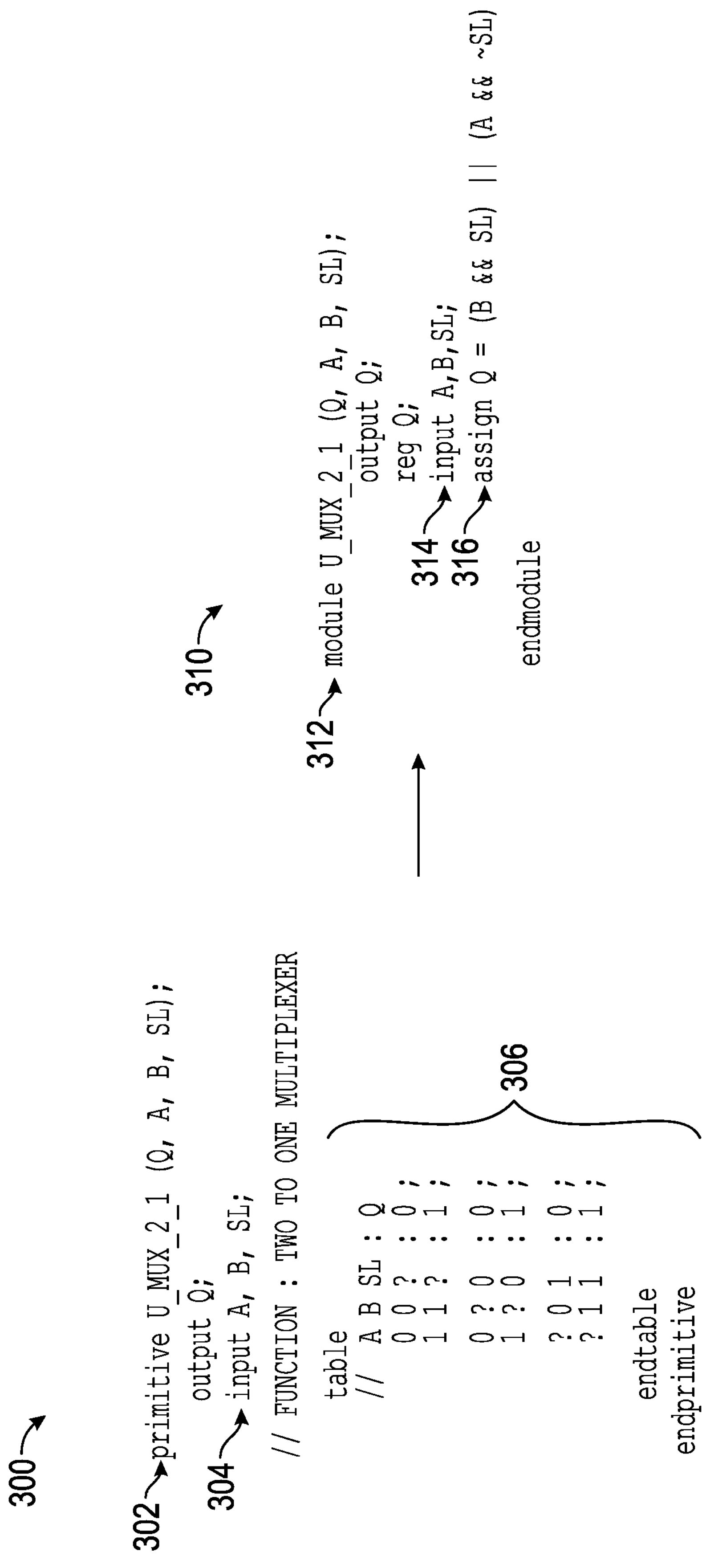
FIG. 3 depicts a 2-to-1 multiplexer converted to a module with a single continuous assignment statement.

FIG. 3 displays a user-defined primitive instance of a purely combinational 2-to-1 multiplexer (mux) 300 that has been converted into an equivalent module definition 310. The combinational mux 300 may have a primitive definition 302, lines 304 representing inputs and an output and a table 306 which defines operation of the mux. Module 310 includes a module definition 312, lines 314 representing output, input and a register and a continuous assign statement 316.

In the case of a purely combinational primitive design 300, it may be that no procedural blocks are necessary within the module definition 310 as the device may have no edge sensitivities. Instead, the behavior of the device may be described using a single continuous assign statement 316 for each output. Once all sub-modules and user-defined primitives have been converted and appended to the preprocessed file, a call to Verilator may be made on the preprocessed file to produce the syntax tree of the Verilog code in XML format. Once the syntax tree has been created, it may be converted into a Python Ordered Dictionary structure and passed to the flattening script.

The role of the flattening script may be to replace any or some of the sub-module instances within the top-level module with their respective behavioral code. To do this, the script may perform a depth-first walk of the syntax tree dictionary. When a sub-module instance is found within a higher-level module, one of two things may occur. If the sub-module instance has itself already been parsed, the contents of the sub-module definition may be copied into the higher-level module's syntax tree and all variable names within the module definition may be replaced with the corresponding port names in the higher-level module. The sub-module instance may then be removed from the syntax tree of the higher-level module. If the sub-module has not yet been parsed, a recursive call may be made to the parsing function on the sub-module instance. In this way, the top-level module is recursively flattened from the bottom up.

Two directed graphs may be generated from the AST. The first may consist of sequential or blocking operations and may correspond roughly to the control and data flow graphs for software. The second is the combinational logic, corresponding to basic blocks in software. Sequential graphs may be useful for bus identification and hierarchy reconstruction. Combinational graphs may provide a structure for signature comparison. Boolean satisfiability (SAT) solver-based techniques may be one mechanism by which signature matching may be performed. Further, apart from asynchronous designs, all combinational graphs may be considered trees. Tree isomorphisms may be efficient, unlike SAT solvers or loopy graph isomorphisms. Trees may also lend themselves to fuzzy matching algorithms not available to general graphs.

Figure 4:
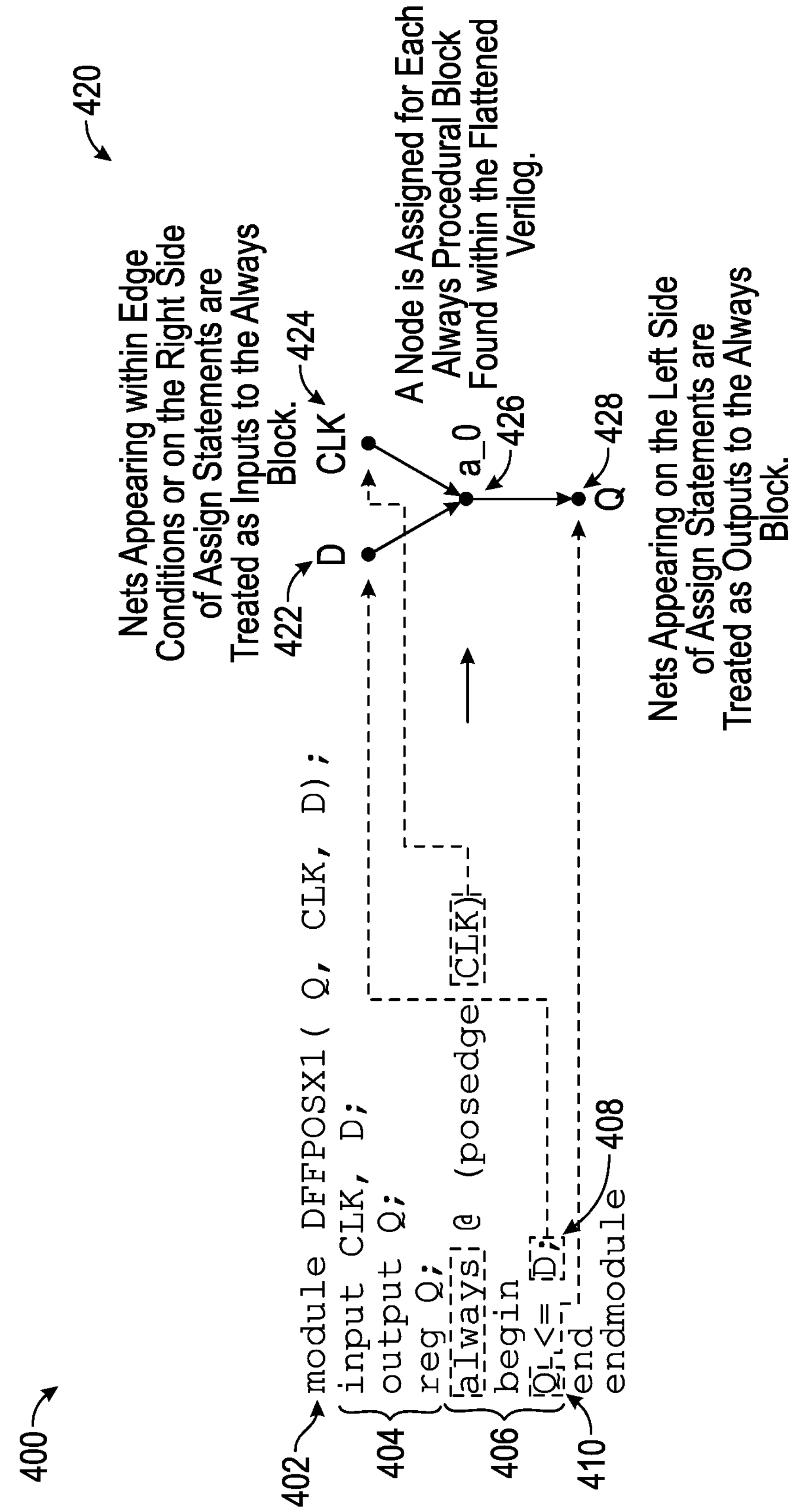
FIG. 4 shows a procedural always block graph representation.

FIG. 4 illustrates one method of construction of a sequential graph 420 from module code 400. Module code 400 may include a module definition 402, lines 404 specifying input, output and a register and a continuous always block 406 which continually assigns the onput 'D' 408 to the output 'Q' 410.

As shown, a sequential graph 420 of a design may be formed by adding a node 426 for each procedural always block 406 found within the flattened Verilog file. Any nets appearing in the edge condition, within if conditionals, or appearing on the right side of assign statements within the always block are considered inputs to the block. A node is added to the graph for each input pointing from the input node to the always block node. Alternatively, any nets assigned a value within the always block (those appearing on the left side of assign statements) are considered outputs to the block. A node is added to the graph for each output pointing from the always block node, to the output node. The sequential graph 420 includes 'D' 422 and 'CLK' 424 inputs and 'Q' output 428.

Figure 5:
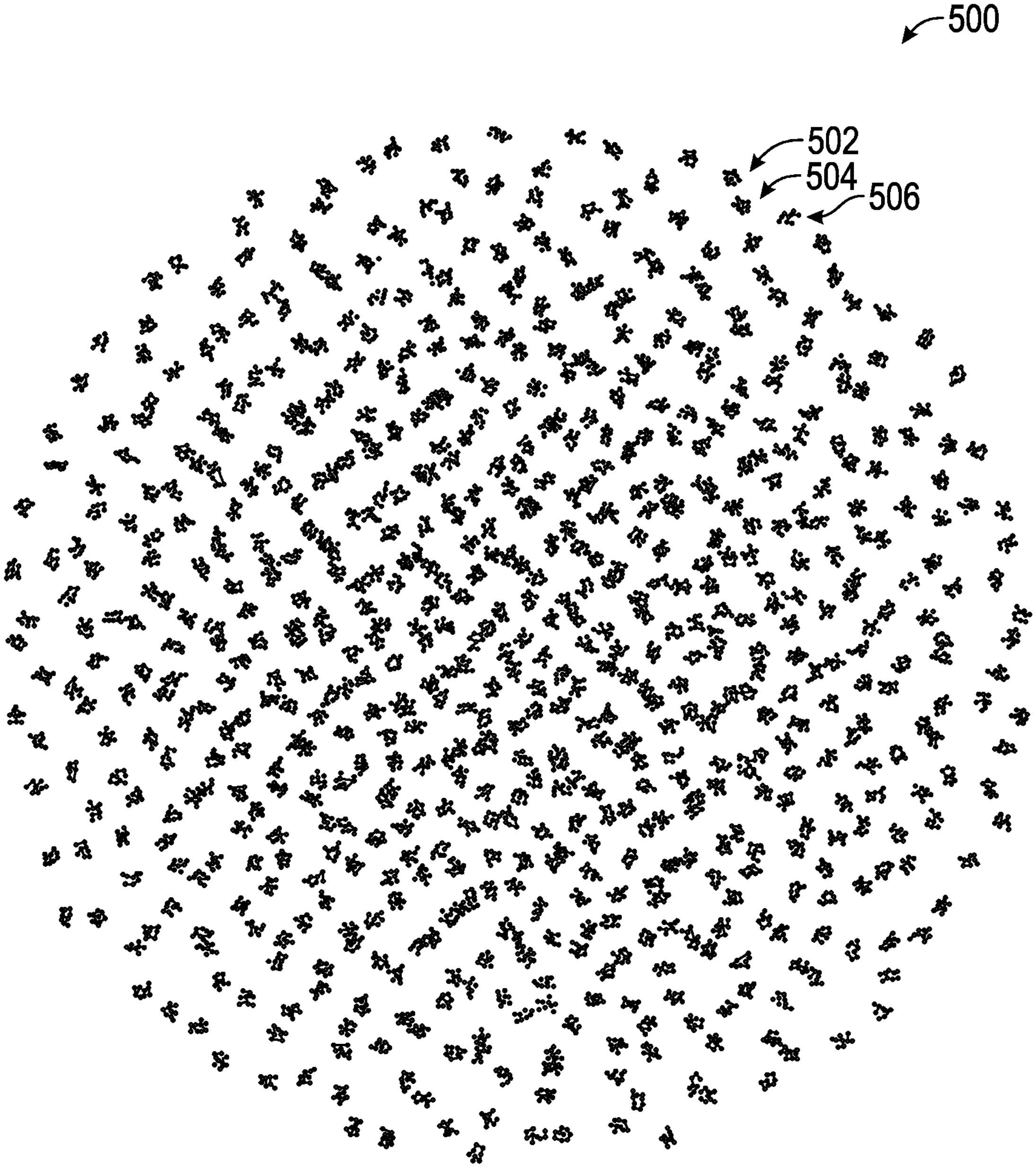
FIG. 5 shows connected components of a sequential graph representing individual registers.

FIG. 5 illustrates that a netlist may incorporate possibly thousands of procedural always blocks. One method of isolating the registers of the design may be to remove the clock signal from the generated sequential graph and separate all connected components. The resulting 'islands' 502-506, etc., shown by the graph may correspond to the different registers in the design. Removing the clock signal may be done either manually or heuristically. For most sequential graphs, clock, reset, and other global synchronizing events may be heavily utilized. This flows from the definition of a sequential graph. A threshold may, thus, be set for a degree of nodes, and all nodes above that degree may be removed. In practice, the gap may be large such that a six-sigma threshold is not unreasonable by default, though this may be arbitrarily adjusted.

Figure 6:
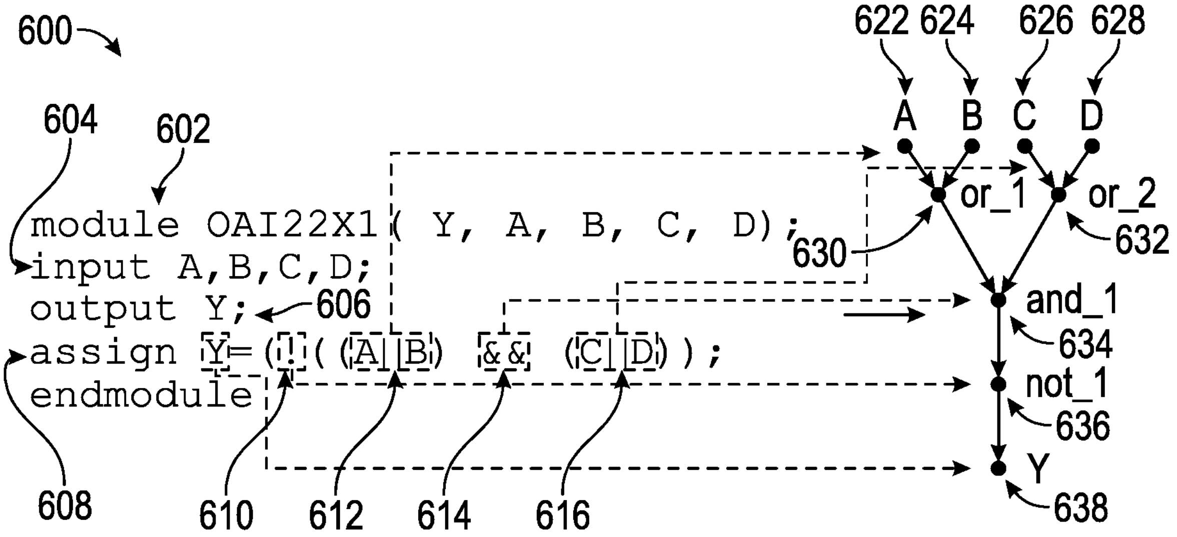
FIG. 6 is one example of a combinational graph representation of a logic cell.

FIG. 6 illustrates a combination graph 620 constructed of an OAI22X1 cell 600, which is may be comprised of two ORs 612, 616, one AND 614, and one NOT 610 operation. It should be noted that the configuration of the combination graph 620 may vary among embodiments. The OAI22X1 cell comprises a module definition 602, input line 604, output line 606 and continuous assign statement 608.

The fan out of a given connected component representing an always block may feed into the combinational logic of the design as an input. Alternatively, the inputs to the always block may feed out of the combinational logic as outputs, and thus a loop may be formed between the combinational logic and memory portion of the design. Furthermore, the combinational 'path' between the fan-in and fan-out of a given always block may provide a potential means of register mapping between similar designs. The combinational graph of the design may represent all combinational logic in the form of a directed acyclic tree. The graph may be formed by assigning nodes to all or some of the nets, wires, and operators appearing in continuous assign statements within the flattened Verilog file. An edge may be drawn from any net or wire to the operator which acts upon it. Similarly, an edge may be drawn from any operator to any wire which has a value assigned the result of the operator acting on other nets in the design.

Combination graph 620 includes inputs 'A' 622, 'B' 624, 'C' 626 and 'D' 628. The two ORs 612, 616 are represented in the graph as or_1 630 and or_2 632. AND 614 is represented by and_1 634. NOT 610 is represented by not_1 636. Output Y 606 is represented by 'Y' 638.

While signature matching of logical structures may be easier in hardware than in software, registers may prove difficult to recover in hardware. Register recovery may be akin to array/struct recovery in software, but unlike an array in software, which may be inferred by specific events such as C subroutine calls, for example, malloc( ) or memcmp( ) subroutine calls, registers may need to be found by analyzing the netlist graph structure. This work may leverage, for example, the RELIC algorithm as one method to detect registers. The RELIC algorithm may assume a group of flip-flops with similar fan-in structures are likely to be in the same word of a register, whereas a group of flip-flops with vastly different fan-in structures are unlikely to be related. Nodes going out of or into flip-flops may form roots or leaves respectively in the combinational graph. Finding fan-in and fan-out may then consist of finding all paths through the tree which connect to these nodes. The RELIC algorithm may approximate graph isomorphism by computing a fuzzy similarity score between logic structures. By comparing the similarity of the fan-in structure of every pair of flip-flops in a netlist, an undirected graph may be created to visualize the relationships between individual registers. In this similarity graph, flip-flops in the original netlist may be represented as nodes, with edges between them indicating a similarity score greater than zero and the edge weight relating to the similarity score. When low-weighted edges are filtered out, the resulting graph may contain separate connected components, with each connected component indicating a group of similar flip-flops. Using this method, RELIC may be able to successfully identify all bits of multi-bit registers in many test cases; however, RELIC may also returns false positives or fails to recognize relationships in others.

A more robust register detection method may aggregate results from multiple algorithms in addition to RELIC to accurately recover register bit groupings across situations where a single algorithm would fail to yield useful results. To this end, other methods of identifying multi-bit dataflow structures may also be used, such as identifying counter or multiplexer structures. Identified word-level structures such as these may reveal information about busses, which may be propagated forward and backward through the netlist to identify other word-level structures connected to the identified components. Identifying busses and word-level objects in a netlist may be a crucial step for converting netlists back into behavioral RTL. Such identification may, for example, elevate the conversion process to a higher level of abstraction, with a focus on identifying word-level operations and data path recovery rather than identifying single-bit structures floating in a sea of gates. This may make components of the design more human-identifiable and is a necessary step for recognition of higher-level modules and behavior.

Figure 7:
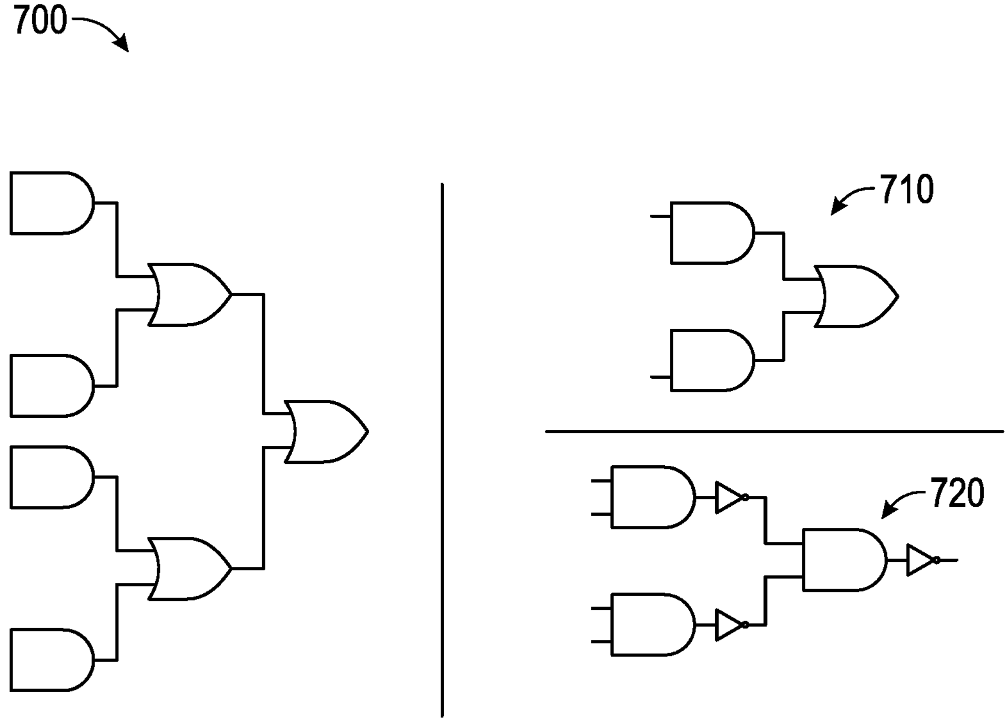
FIG. 7 depicts several examples of multiplexer unit structures.

FIG. 7 shows example multiplexor unit structures 700, 710, 720. Multiplexers can be identified in a netlist by building up from a basic 2-input 1-bit mux unit structure. This structure has been observed to form the basis of multiplexer components across synthesis tools and cell libraries. In other embodiments not shown, a multiplexer may have greater or fewer inputs and/or greater or fewer input bits.

Building on this pattern, a 1-bit multiplexer with N select bits may be represented as a binary tree of AND and OR gates, with all or some of the stem nodes being OR gates and all or some of the leaf nodes being AND gates. The number of AND gates in the tree may be equal to the number of select bits N. To form an M-bit multiplexer with N input busses, M 1-bit mux tree structures with N inputs each may be instantiated and connected to the same select logic. Input bits of the same bus index of each of the M 1-bit structures may be connected to the same driver node.

To identify these structures in a netlist, a list of 1-bit multiplexer structures may be built by searching for instances of the mux unit structure and recursively identifying larger 1-bit mux structures built upon these units. Once all 1-bit structures have been identified, multi-bit multiplexer structures may be identified by searching the list of known structures for shared driving nodes. While the logic of the structures may remain the same, the actual gate-level encoding of this logic may vary considerably across and within netlists. The graph creation process may convert the combinational graph structure to include only AND and NOT gates in order to allow isomorphic matches to be independent of the varying implementations.

FIG. 8 shows a section of a combinational graph 800 shaded to show extracted multiplexer structures. Purple nodes 802 indicate non-multiplexer gates and each of the 8 groups of non-purple nodes 804-818 represent a 4-input 1-bit multiplexer slice.

A mux structure is an example of a structure which may be identified by starting with a 1-bit sub structure and moving recursively outwards. Other structures that may be identified include demultiplexers, adders, multipliers, decoders, shifters and other logic structures.

Software may be delimited by basic blocks. A basic block may be a section of code wherein some or all instructions are executed sequentially without repetition or interruption. These may be identified by looking for instructions which interrupt control flow. For example, by identifying the setup instructions of a function, the beginning of a basic block may be identified, as it may be the target of a call, for example, a jump, instruction. Similarly, the instructions which terminate a function may signify the end of a basic block since the function may, in some cases, necessarily return control to another basic block. Ultimately, identifying these parts may allow for one to identify the basic blocks which are being used to generate a control-flow graph of the program. The software decompiler may simply need to use its knowledge of the program structure and the syntax to generate the higher-level source code.

Embodiments directed to methods for performing combinational and sequential graph analyses are described herein.

Hierarchy and module reconstruction in hardware may invoke difficult and subjective problems. Module reconstruction may not have a good analog in software since hardware lacks the aforementioned delineating instructions. To gain some traction, hierarchy reconstruction in hardware may be addressed by computing maximal directed cycles in the sequential graph, as is done for reintroducing loops in software. Structures with input/output (I/O) that are comprised of identified registers or control bits (such as clock or reset bits or lines), which may appear repeatedly, may be labeled as modules. This still may have limited success for two reasons. First, instances of modules may not be repeated with near the frequency of function calls in software. Secondly, mining subgraphs may implicate a nondeterministic polynomial time (i.e. NP complete) problem. Fortunately, both the software and hardware community reuse code heavily. Signature matching or finding smaller known functions within an unknown code base may be computationally much more feasible than directly mining the entire graph for the unknown codebase.

Various software tools may be used to perform such signature matching and function identification processes within an unknown code base, as described above. An application, such as BinDiff, for example, may work on the abstract structure of an executable, ignoring the concrete assembly-level instructions in the disassembly. The structure of the functions and basic blocks (i.e. the features of the control flow graph) may be what is used for analysis. For example, the application may count the call graph edges, or the number of calls to get to a function in a binary and compare it with functions in the other binary to see if any match. By repeating this procedure on all the functions in the two files, the application may obtain a score for how similar the two binaries are overall.

FIG. 9 presents a sub module match diagram 900 and an exemplary flow diagram 920 that illustrates the above-described process of signature matching and function identification as performed for a given netlist. As is described above, a netlist may generally be a composite of modules with specific functionality such as adders, timers, and multiplexers. By employing the same techniques described above, the modules making up a netlist may be compared with a large set of pre-analyzed netlists of common hardware components in order to find a match.

The diagram 900 on the left hand side of FIG. 9 illustrates that a design 902 may have a plurality of inputs 904, a plurality of outputs 906 and a plurality of sub modules 908-912. At least one of the sub modules 912 of the design 902 may be identical to, for example, having a same signature as a sub module 914 found in a database 916 or repository.

In an embodiment, to perform a signature match between a given netlist and common hardware components, a system may receive, via a receiver, a plurality of netlists corresponding to the common hardware components. This may be received from a server over the Internet, from a library server, from a server provided by a hardware component manufacturer or the like. In an embodiment, the comparison may be done locally. Alternatively, or in combination, the given netlist may be transmitted, via a transmitter, to a remote server for comparison. The transmission may include parameters about the given netlist. The remote server may perform signature matching and function identification and may provide a list of the common hardware components used in the given netlist. This list may include identifiers of or for the common hardware components. Alternatively, or in combination, the remote server may provide code or links to code for the common hardware components, for example, if the code is publicly available. If the code matches a manufacturer specific IP core, the server may provide information about the manufacturer or the specific IP core, however, higher level code may not be provided.

The applicability of these signature matching and function identification algorithms for this task works well since applications as described above may be designed to work on different architectures and across different compilers with different optimizations. As such, netlist comparisons may work with respect to different platforms, implementations, and manufacturing intricacies. Potential module matches identified through subgraph matching may be confirmed using a satisfiability algorithm, such as an SAT solver. The combinational graph of the design may be walked-through to produce a set of Boolean logic equations that define the combinational logic for the design. These equations may be formatted for use with a theorem prover, such as Z3, in one example. For instance, the equations may be formatted for the Python Z3 application programming interface (API) and stored in Z3 class objects. It the combinational graph may also include internal wires, which may be defined, for example, in a flattened Verilog file. In instances where these wires are not needed, the equation set may be reduced using a composition of the corresponding Boolean logic equations. Control functions of the logic equation data structure may provide a means to perform operations on the structure. A list of possible links between inputs and outputs in the two graphs may be generated or possible mappings may be passed in from the isomorphic match process. These sets may then be used to form inputs for the satisfiability algorithms, for example, SAT assertions to run in Z3.

The flowchart 920 of FIG. 9 illustrates the comparison of a database module 922 having lines 924 and equations 926 which may be compared to a design sub module having lines 930 and equations 932. In this example, test vectors may be generated 934 from the design sub module 928 and fed 936 to the Z3. If there is a match candidate 938, a signature match 942 may be checked. Otherwise, the search space may be reduced 940 and the process continued.

FIG. 10 presents an example of a reduction process 1000 to be performed on the combinational graph or graphs. Components and modules that comprise a larger design may be identified through signature matching. Once the initial combinational graphs have been generated for the netlist, a reduction process may be performed on both the netlist graph and the signature graph in which intermediate wire nodes are removed and XOR and OR nodes are reduced to ANDs and NOTs. The reduction process may, for example, allow the process of signature matching to be agnostic to the way logically equivalent graphs are implemented in hardware. After the graphs have been reduced, combinational subgraphs of interest may be found within the larger design by means of graph isomorphisms with the added constraint of matching corresponding operator nodes. Additionally, partitioning may be used to produce a bounding set on the search space. This aligns itself well with the overall task of extracting RTL components while also helping limit scalability issues in designs with many nodes. Once a subgraph has been identified, its combinational graph may be used to populate a data structure with the corresponding logic equations. This data structure may then be used to create objects for use within the satisfiability algorithm. For instance, Z3 expression objects may be generated for use during SAT solver steps. Submodules within the database, stored for the purpose of comparison, may be called signature modules, and subgraphs pulled from the design being decompiled may be called the candidate modules. Candidate modules may be provided to, for example, transmitted to, a comparison server for comparison. Match results may be transmitted by the comparison server, to the requesting device.

Specifically, the left hand side of FIG. 10 shows a 2-bit binary adder 1000 having two inputs 'A' 1002, 'B' 1004, an AND component 'and_1' 1006 and an XOR component 'xor_1' 1008. The right hand side of FIG. 10 shows a simplified version of the 2-bit binary adder 1020. The simplified binary adder has same inputs 'A' 1022 and 'B' 1024 as well as a same AND gate 'and_1' 1026 as the AND gate 1006 on the left hand side. However, 'xor_1' 1008 has been replaced in the simplified adder 1020 with simpler logic 1028 comprised of AND and NOT gates.

Described herein are embodiments directed to module recovery and generation of Register Level Transfer code.

As shown in FIG. 11, logic equations may be extracted from the combinational logic and represented in a database. Specifically, FIG. 11 shows extracted logic 1102 and a structural representation 1104 which may be stored in a logic database. For example, combinational graphs of the database signature and candidate subgraph modules may be loaded into a logical equivalence checking (LEC) script that populates a data structure with the logic equations. The equations may be stored and referenced by a key value corresponding to their node in the graph. The terms in the equation may be replaced with dummy variables and a list may be created to maintain a link between the dummy variables and the term names in the design.

The logic data structure may allow for various utilities to be used to assist the LEC process. Any of the following actions may be performed in alone or in combination. For example, simplification of equation sets may be performed. Wires may be classified quickly as input, output, or intermediate. Output complexity may be measured by analyzing the number of operations, inputs, and connectivity involved. This may assist in determining the least to most significant bit order in modules whose output complexity has a relationship to bit position, when not obtained through graph isomorphism.

FIG. 12 depicts an example of combinational graph 1200 upon which the LEC process is performed. The graph shows eight data inputs including B[3] 1202, B[2] 1204, B[1] 1206, B[0] 1208, A[3] 1210, A[2] 1212, A[1] 1214, A[0] 1216 plus an ALU select bit 1218. Four output bits ALU_Out[3] 1220, ALU_Out[2] 1222, ALU_Out[1] 1224, and ALU_Out[0] 1226 provide the result of an addition (add) or subtraction (sub). The combinational graph 1200 depicts a 4-bit Arithmetic Logic Unit (ALU) with add (control is false) and subtract (control is true) functions. Various logic gates 1228 are shown for implementing the ALU. The netlist is put through the workflow, preprocessed, flattened, and used to generate a flat Verilog output along with a combinational graph. The logic equations for the outputs 1220-1226 may be extracted from the combinational graph. Other examples of high level logic units include an address generation unit (AGU), floating point unit (FPU), memory management unit (MMU), transaction lookaside buffer (TLB), etc. These logic units may be matched in a similar fashion to the ALU example.

The combinational graph of the ALU may be scanned for isomorphic matches to database entries. Being able to identify the control bits of the multiplexer may help to prune off other subgraphs from the combinational graph. A match with extra branches may also be fed into the LEC script with the additional inputs asserted true or false, to elicit a graph isomorphism by determining if the branch may be pruned.

FIG. 13 illustrates combinational graphs 1300, 1310 which demonstrate an example pruning process of the combinational graph 1200. The pruning is performed by asserting a value on a mux control. For simplicity purposes, both graphs 1300, 1310 show only the two least significant bits from the combinational graph 1200 of the above described ALU. In combinational graph 1300, the branch representing subtractor logic 1314 is removed and only a first and second least significant bits 1302-1308 from the combinational graph 1200 of the ALU is shown. When a control bit 1334 of the multiplexer is asserted false, the middle branch of the combinational graph representing the logic unique to subtraction may be pruned off. The branch of the graph unique to addition may remain.

Combinational graph 1300 includes 4 input bits B[1] 1302, A[1] 1304, B[0] 1306 and A[0] 1308; and an ALU-Sel 1310. ALU_Out[1] 1312 represents a single output. Subtractor logic 1314 is included in combinational graph 1300 and is not shown in combinational graph 1320. Combinational graph 1320 includes 4 input bits B[1] 1322, A[1] 1324, B[0] 1326 and A[0] 1328; and an ALU-Sel 1330. ALU_Out[1] 1332 represents a single output.

In the case described above, for the ALU, matches for a 1-bit adder and subtractor may be matched first. Each match candidate's combinational graph and node mapping may be passed to the LEC script. The script may convert the combinational graph into an expression object, such as a Z3 expression object, for example. The script may perform any necessary utility functions and construct an assertion set for the solver algorithm, which may be, for example, a Z3 SAT solver. For any subgraph that is shown to be logically equivalent, subsequent passes of the subgraph matching process may attempt to match larger modules that contain the matched module. In this way, the next test could, for instance, involve matching a larger subgraph that included 2-bits. As depicted in FIG. 13, the process correctly identified subgraphs for a 4-bit adder and a 4-bit subtractor. When fed into the LEC script, the logic associated with the combinational graphs was shown to be equivalent by the Z3 assertion tests generated.

FIG. 14 provides an example of a scenario 1400 in which a subgraph 1402 of an output is matched to an output of a 4-bit adder 1404. As shown here, a subgraph match may be determined between the pruned ALU combinational subgraph 1402 and the adder 1404 where their combinational graphs would be compared by converting them to include only AND and NOT gates. For readability, FIG. 14 shows only the second least significant bit and XOR gates were not converted, however it may be appreciated that the subgraph match may occur on all included bits simultaneously with the entire graph converted to AND and NOT.

Exact nodal mapping may not always be given by graph isomorphism, particularly in the case where a looser match is attempted. The script may choose to match the signature output equation to a candidate output equation based on various complexity metrics such as: number of terms, distance in graph from input to outputs, and number of different inputs. The script may use such metrics alone or in combination. These may, for instance, allow the script to attempt to align the least significant bits. The LEC script may then apply an algorithm to determine possible permutations of input mappings and output mappings between the signature and candidate in a depth first search. In some embodiments, the script may do so by attempting one or more SAT solver checks. It should be noted that although the above process is described in the context of one configuration of an ALU, other configurations of other logical components may be possible. Table 1 depicts performance metrics for the matching operations generally described above. As shown, the process was able to fully match an adder and subtractor in the example explained above. In addition, a 4-bit 16 function ALU was also used. Database entries for the 4-bit adder and 4-bit subtractor were matched as well.

TABLE 1

LEC Script Performance Metrics

| LEC | 8-bit 16 function ALU |
|---|---|
| Adder - Number of Tests with Bus ID | Bit 0: 4 tests - 2 pass<br>Bit 1: 2 tests - 2 pass<br>Bit 2: 2 tests - 2 pass<br>Bit 3: 2 tests - 2 pass |

TABLE 1-continued

LEC Script Performance Metrics

| LEC | 8-bit 16 function ALU |
|---|---|
| Adder - Total Execution Time | 23.311 s |
| Subtractor - Number of Tests with Bus ID | Bit 0: 4 tests - 2 pass |
| | Bit 1: 2 tests - 1 pass |
| | Bit 2: 1 tests - 1 pass |
| | Bit 3: 1 tests - 1 pass |
| Subtractor - Total Execution Time | 22.965 s |
| Multiplier - Number of Tests with Bus ID | Bit 0: 4 tests - 2 pass |
| | Bit 1: 2 tests - 1 pass |
| | Bit 2: 1 tests - 1 pass |
| | Bit 3: 1 tests - 1 pass |
| Multiplier - Total Execution Time | 23.510 s |

As described below, several test articles were developed to use in experiments for collecting empirical data. Python scripts for generating the sequential graphs were run on a Serial Peripheral Interface (SPI) netlist that was extracted from a fabricated layout. The SPI was comprised of roughly 400 cells, including 63 flip flops. The graph was generated in 9.13 seconds on an Ubuntu 18.03 virtual machine run on a host computer with an Intel Core i5-835U CPU running at 1.7 Ghz. The graph contained 806 nodes and edges and revealed the flip flop structures of the extracted netlist. Signature matching was done with the Python Z3 API for exact matches and Levenshtein Distance for fuzzy matching due to convenience of implementation.

This framework also makes comparative validation easier. To this end, sequential and combinational graphs were constructed for a floating-point unit (FPU) golden test article along with the same FPU design with inserted malicious circuitry. The inserted circuitry was designed to break the multiplication design pipeline after a specific clock cycle count. Differences between the two graphs were extreme as shown in FIG. 15.

FIG. 15 shows sequential graphs of a golden FPU 1500 and an FPU with malicious insertion 1510. The graphs 1500, 1510 are analyzed based on degree (i.e. the number of nodes/edges connected to the node being analyzed.) The original design on the left is dominated by the clock signal which has degree 1384 in the sequential graph and the inverted reset in the combinational graph with degree 537. All flip-flops also are identical and contain 7 nodes. However, the design containing the malicious insertion on the right has a combinational graph with 13 nodes of degree between 46 and 86 including reset and a sequential graph with 6 nodes of degree between 170 and 174.

One notable observation was the single flip-flop with 8 nodes, the extra being the reset. Upon deeper inspection, this is a differential flip-flop which asserts reset on an event. While the event is not trivial to recover with the current maturity of the toolset, this behavior is indicative of a denial-of-service-like Trojan that would reset the FPU.

A denial-of-service-like Trojan could be a significant problem for a hardware device company with devices deployed in field. For example, in a consumer product such as a camera, cellular telephone, computer, tablet or other electronic device that may be remotely software, firmware or hardware upgradeable, a Trojan horse could cause tremendous damage to the manufacturer's reputation as well as to the end user. Thus, a device manufacturer should perform comparative validation to ensure that a denial-of-service-like Trojan will not be programmed in device firmware, hardware or software. Manufacturers or others may perform comparative validation prior to reconfiguration of a remote device. In an embodiment, a manufacturer may require that a device perform comparative validation before mapping to an FPGA of the device.

In an embodiment, a field programmable device may be configured to transmit a message to a device manufacturer or operator requesting that a comparative validation occur. The manufacturer may perform the verification and provide the remote device with a key so as to allow a hardware reconfiguration. Alternatively, a remote device may be instructed to not load a configuration based on an inability to perform comparative validation or when a comparative validation fails, for example.

In order to obtain metrics for real world devices with different sized netlists, the workflow was completed for a SPI module, a floating-point unit, floating-point processor, and AES core. The results of these runs are shown in Table II. Note that while the AES core example incorporates far more combinational logic, the sequential graph of the design has far fewer nodes than the processor example leading to short runtimes. The metrics help to assess the scalability of workflow over larger netlists as a design grows in complexity. The tests were run on the same Ubuntu 18.03 virtual machine from the host computer with an Intel Core i5-835U CPU running at 1.7 Ghz.

TABLE 2

Parsing Script Performance Metrics

| | SPI Interface (small) | FPU (medium) | Processor (large) | AES Core (very large) |
|---|---|---|---|---|
| Preprocessing Time | 0.0908 s | 1.7392 s | 2.8044 s | 2.3347 s |
| Flattening Time | 1.0093 s | 69.7800 s | 468.2448 s | 364.1546 s |
| Graph Generation Time | 0.2561 s | 2.3497 s | 20.7657 s | 7.2002 s |
| Z3 Equation Generation Time | 0.0088 s | 3.3183 s | 15.2150 s | 12.5707 s |
| Total Execution Time | 1.8072 s | 98.7551 s | 614.6092 s | 549.8556 |
| Combinational Nodes | 1,156 | 35,819 | 84,429 | 151,140 |
| Combinational Edges | 1,316 | 47,634 | 111,434 | 217,592 |
| Sequential Nodes | 2,420 | 6,229 | 27,519 | 7,808 |
| Sequential Edges | 4,278 | 8,996 | 39,663 | 7,806 |

Experiments were also performed to evaluate the mapping of non-database modules to known database structures.

A portion of the ABS core was scanned for subgraph matches. Signature graphs from the database were used to identify candidate subgraphs within the ABS core to perform a LEC on. Table 3 provides metrics for the performance of such operations.

TABLE 3

Parsing Script Performance Metrics

| | Candidates | Logical Equivalent | Execution Time |
|---|---|---|---|
| Half Adder | 21 | 7 | 3.25 s |
| Half Subtractor | 20 | 15 | 2.18 s |
| Mux 1 × 2 | 20 | 8 | 0.99 s |
| Mux 2 × 1 | 20 | 10 | 1.36 s |

As presented in paragraphs above, workflows for decompilation, for example, of a gate-level netlist into a human readable RTL Verilog file may be derived. Software decompilation methodologies may be leveraged to enable this process although techniques and the challenges vary between software and hardware.

In an example of mapping non-database modules to known database structures, an 8-bit counter was compared to a 4-bit toggle flip-flop counter within the database. The Verilog files for the designs are shown below.

TABLE 4

Verilog Code for 4-bit Toggle Flip-Flop Counter

```
module top(clk, reset, count);
input clk, reset;
output[3:0] count;
/reg [3:0] count;
wire clk, reset;
wire T3
wire T2
wire T1
wire T0
assign T3 = count[0] & count[1] & count[2];
assign T2 = count[0] & count[1];
assign T1 = count[0];
assign T1 = 1'b1;
TFF_async_clrN reg3(.T(T3),.clk(clk),.clrN(reset),.q(count[3]));
TFF_async_clrN reg3(.T(T2),.clk(clk),.clrN(reset),.q(count[2]));
TFF_async_clrN reg3(.T(T1),.clk(clk),.clrN(reset),.q(count[1]));
TFF_async_clrN reg3(.T(T0),.clk(clk),.clrN(reset),.q(count[0]));
endmodule
```

TABLE 5

Verilog Code for 8-bit Counter

```
module top(clk, reset, count);
input clk, reset;
output[7:0] count;
reg[7:0] count;
wire clk, reset;
always@(posedge clk or negedge reset)
begin
if (~reset)
   count = 8'b0;
else
   count = count + 8'b1;
end
endmodule
```

Once the 8-bit counter was put through the workflow, the Z3 files were created and compared to the database entry Z3 file of the 4-bit counter. A matching subgraph was determined for the lower 4 bits of the 8-bit counter. From there, the modules were loaded into the LEC script.

The code below, shown in Tables 6 and 7, presents the database counter and subgraph after having populated the logic data structure.

TABLE 6

Subgraph Output Logic

```
{_00_[0x0]: [ '( ~{ } ) ', [ 'count [0x0] ' ] ] }
{_00_[0x1]: [ ' ( { } ^ { } )', [ 'count[0x1]' , 'count[0x0] ' ] ] }
{_00_[0x2]: [ '(~ ( ( { } & { } ) ) )   ) ) )', ['count [0x2]', 'count[0x1]',
'count[0x0]' ] ] }
{_00_[0x3]: [ '(~ ( ( { } ^ ( ~ ( ( { } & { } )& { } ) ) ) ) )', ['count[0x3] ',
'count[0x1]', 'count[0x0] ', 'count[0x2]'] ]}
```

TABLE 7

Database Module Logic

```
{_0__1: [ ' ( { } ^ 1)', [ ' T1 ' ] ] }
{_0__2: [ ' ({ } ^ { } ) ', ['count[0x1]' , 'T1' ] ] }
{_0__3: [ ' ({ } ^ ( { } & { } ) ) ' , ['count[0x2] ' , 'T1',
'count[0x1] ' ] ] }
{_0__4: [ ' ( { } ^ ( { } & ( { } & {} ) ) ) ', ['count[0x3] ', 'T1' ,
'count[0x1] '] ] }
{T0: [ ' (1)' , [ ] ] }
```

The control code may search for logically equivalent equation structures using dummy variables. The control code may pass parameters to the code generator to develop Z3 tests. If the tests show that the equations are never different, a match is made. One iteration of this is shown below in Tables 8 and 9. Once the process is complete, a list of matches are returned along with an output of any one-to-one matched equations.

TABLE 8

Example of a Z3 Assertion Set

```
y1 = BitVec ('y1' , 1)
y2 = Bit Vec ('y2 , 1)
var4 = BitVec ('var4' ,1)
var3 = BitVec ('var3' ,1)
var2 = BitVec ('var2' ,1)
var1 = BitVec ('var1',1)
s.add(y1 = = ( var4 ^ ( var3 & ( var2 & var1 ) ) ))
s.add(y2 = = (~ ( ( var4 ^ ( ~ ( ( var3 & var2 )& var1 ) )   ) ) ) )
s.add(y1 != y2)
goutput = s.check( )
```

TABLE 9

Set of Match Candidates

```
_0__1 = = (T1 ^ 1)
_00_[0x0] = = (~ count[0x0])
_0 __ 2 = = ( count[0x1] ^ T1 )
_00_[0x1] = = ( count [0x1] ? count[0x0] )
_0 __ 3 = = ( count[0x2] ^ ( T1 & count[0x1] ) )
_00_[0x2] = = ( ~ ( ( count[0x2] ^ ( ~ ( ( count[0x1] &
count[0x0] ) ) )   ) ) )
_0__4 = = ( count[0x3] ^ ( count[0x2] & ( T1 & count[0x1] ) ) )
_00_[0x3] = = ( ~ ( ( count[0x3] ^ ( ~ ( ( count[0x1] &
count[0x0] )&
count[0x2] ) )   ) ) )
```

Although merely a few examples of decompilation processes are described herein, one of ordinary skill in the art will appreciate that each feature or element can be used alone or in any combination with the other features and elements. In addition, the methods described herein may be implemented in a computer program, software, or firmware incorporated in a computer-readable medium for execution by a computer or processor. Examples of computer-readable media include electronic signals (transmitted over wired or wireless connections) and computer-readable storage media. Examples of computer-readable storage media include, but are not limited to, a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A method comprising:

receiving a netlist;

converting at least one table of the netlist, which defines a user-defined primitive of the netlist, to behavioral code which defines a behavior of the user-defined primitive with at least one procedural always block;

constructing register transfer level (RTL) code based on the behavioral code;

generating a sequential graph based on the RTL code; and identifying registers by removing a clock signal from the sequential graph.

2. The method of claim 1, further comprising:

parsing the netlist to produce an abstract syntax tree (AST).

3. The method of claim 2, further comprising:

generating directive graphs from the AST.

4. The method of claim 1, further comprising:

converting library instances of the netlist to behavioral code.

5. The method of claim 1, further comprising:

flattening a hierarchy of the netlist, by replacing sub-module instances with respective code.

6. The method of claim 1, further comprising:

reducing a number of unnecessary variables by replacing input and output with corresponding wires from a top-level module of the netlist.

7. The method of claim 1, further comprising replacing any sub-module instances within the top-level module with respective behavioral code.

8. The method of claim 1, further comprising:

generating a list of instantiated sub-modules.

9. The method of claim 1, further comprising:

looking for definitions of the sub-modules within the netlist or a helper library file.

10. The method of claim 9, further comprising:

appending source code of one or more of the sub-modules to the RTL code.

11. The method of claim 1, further comprising:

determining whether the netlist contains instances of user-defined primitives.

12. The method of claim 11, further comprising:

converting any user-defined primitives into equivalent module definitions.

13. The method of claim 12, wherein the module definitions contain no procedural blocks.

14. The method of claim 1, further comprising:

producing a syntax tree in XML format based on the netlist.

15. The method of claim 1, further comprising:

identifying one or more multiplexors in the netlist by searching for instances of a mux unit structure.

16. The method of claim 1, further comprising:

determining whether the netlist includes a malicious insertion.

17. A computing device comprising:

circuitry configured to recover a netlist from a fabricated chip circuitry configured to convert at least one table of the netlist, which defines a user-defined primitive of the netlist, to behavioral code which defines a behavior of the user-defined primitive with at least one procedural always block;

circuitry configured to construct register transfer level (RTL) code based on the behavioral code;

circuitry configured to generate a sequential graph based on the RTL code; and circuitry configured to identify registers of the chip by removing a clock signal from the sequential graph.

* * * * *